United States Patent
Paolini et al.

(10) Patent No.: US 7,462,502 B2
(45) Date of Patent: Dec. 9, 2008

(54) COLOR CONTROL BY ALTERATION OF WAVELENGTH CONVERTING ELEMENT

(75) Inventors: Steven Paolini, Saratoga, CA (US); Michael D. Camras, Sunnyvale, CA (US); Oscar Arturo Chao Pujol, Santa Clara, CA (US); Frank M. Steranka, San Jose, CA (US); John E. Epler, Milpitas, CA (US)

(73) Assignee: Philips Lumileds Lighting Company, LLC, San Jose, CA (US)

( * ) Notice: Subject to any disclaimer, the term of this patent is extended or adjusted under 35 U.S.C. 154(b) by 197 days.

(21) Appl. No.: 11/444,592

(22) Filed: May 31, 2006

(65) Prior Publication Data
US 2006/0258028 A1    Nov. 16, 2006

Related U.S. Application Data

(63) Continuation-in-part of application No. 10/987,241, filed on Nov. 12, 2004.

(51) Int. Cl.
*H01L 21/00* (2006.01)
(52) U.S. Cl. .................. 438/22; 438/25; 438/28; 257/88; 257/89
(58) Field of Classification Search .............. 438/22, 438/25, 28; 257/88, 89, 90, 91, 98
See application file for complete search history.

(56) References Cited

U.S. PATENT DOCUMENTS

| | | | |
|---|---|---|---|
| 5,376,580 A | 12/1994 | Kish et al. ............ 438/26 |
| 5,502,316 A | 3/1996 | Kish et al. ............ 257/94 |
| 6,395,564 B1 * | 5/2002 | Huang ................. 438/7 |
| 6,987,613 B2 | 1/2006 | Pocius et al. .......... 359/565 |
| 7,005,679 B2 * | 2/2006 | Tarsa et al. ........... 257/89 |
| 7,009,213 B2 | 3/2006 | Camras et al. ......... 257/98 |
| 7,053,419 B1 | 5/2006 | Camras et al. ......... 257/98 |
| 2002/0030194 A1 | 3/2002 | Camras et al. ......... 257/98 |
| 2003/0089918 A1 | 5/2003 | Hiller et al. |
| 2005/0023545 A1 | 2/2005 | Camras et al. ......... 257/98 |
| 2005/0032257 A1 | 2/2005 | Camras et al. ......... 438/25 |
| 2005/0230689 A1 * | 10/2005 | Setlur et al. .......... 257/79 |
| 2005/0231105 A1 | 10/2005 | Lovell et al. ......... 313/506 |
| 2005/0247944 A1 | 11/2005 | Haque et al. .......... 257/79 |
| 2005/0269582 A1 * | 12/2005 | Mueller et al. ........ 257/94 |
| 2005/0274967 A1 | 12/2005 | Martin et al. ......... 257/98 |
| 2006/0066210 A1 * | 3/2006 | Ng et al. ............. 313/486 |

* cited by examiner

Primary Examiner—Phuc T Dang

(57) ABSTRACT

A light emitting device is produced by depositing a layer of wavelength converting material over the light emitting device, testing the device to determine the wavelength spectrum produced and correcting the wavelength converting member to produce the desired wavelength spectrum. The wavelength converting member may be corrected by reducing or increasing the amount of wavelength converting material. In one embodiment, the amount of wavelength converting material in the wavelength converting member is reduced, e.g., through laser ablation or etching, to produce the desired wavelength spectrum.

23 Claims, 8 Drawing Sheets

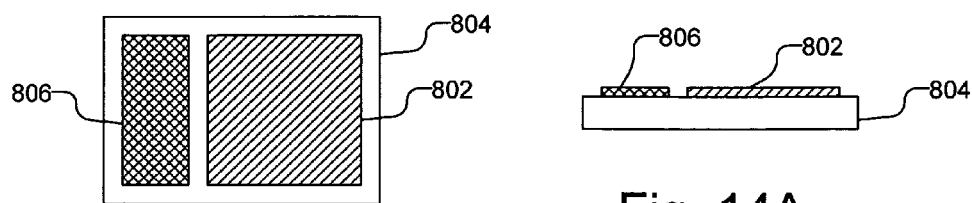
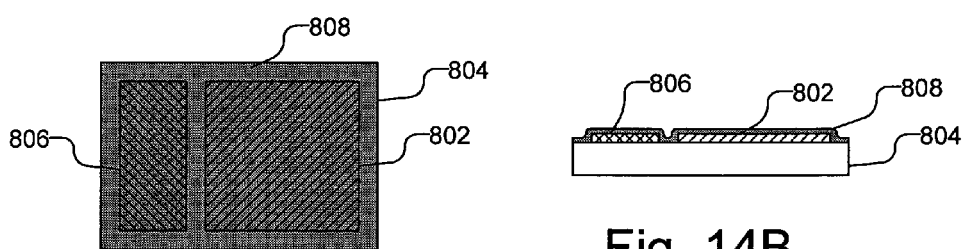
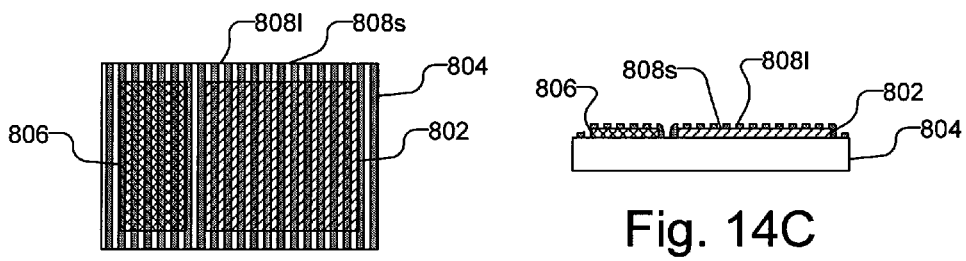
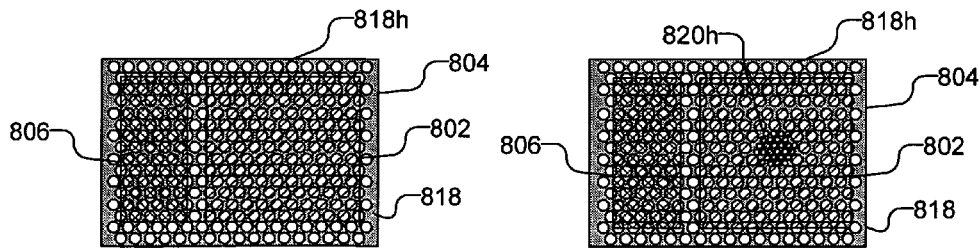
Fig. 13A · Fig. 14A · Fig. 13B · Fig. 14B · Fig. 13C · Fig. 14C · Fig. 15A · Fig. 15B

COLOR CONTROL BY ALTERATION OF WAVELENGTH CONVERTING ELEMENT

CROSS-REFERENCE TO RELATED APPLICATIONS

The present application is a continuation-in-part of and claims priority to U.S. patent application Ser. No. 10/987,241, filed Nov. 12, 2004, entitled "Bonding an Optical Element to a Light Emitting Device", by Michael D. Camras et al, which is incorporated herein by reference.

FIELD OF THE INVENTION

The present invention relates generally to light emitting devices and, more particularly, to controlling the color consistency of light emitting devices that use wavelength converting members.

BACKGROUND

There has been a long term need for precise color control of semiconductor light emitting devices, such as light emitting diodes, that produce "white" light. A common method of making a packaged light emitting device that emits white light is to employ a phosphor (often YAG based) and a blue LED chip. The combination of blue light from the LED and "yellow" light from the phosphor makes "white" light. Unfortunately this approach results in a large spread in the "color" of white light both in terms of correlated color temperature (CCT) and in proximity to the blackbody curve. The color control of phosphor converted LEDs sold today has a range of at least around 2000K to 3000K for white parts with the correlated color temperature (CCT) varying from 5500K to 8500K. Discernable color differences are dependent on the color temperature of the LED and at 6500K, differences as small as 300K are apparent to the viewer. The color control of standard lighting sources, such as fluorescent bulbs, has color temperature variations much less than this and color differences are usually not discernable to the viewer. Although phosphor converted LEDs have been commercially available for more than 5 years, and some improvements have been made, the color temperature still varies too much to be acceptable to most potential customers and applications.

SUMMARY

In accordance with one embodiment of the present invention, a layer of wavelength converting material is deposited over a light emitting element, the wavelength spectrum produced by the combination of the wavelength converting material and the light emitting element is determined, and the wavelength converting material is corrected by altering the amount of wavelength converting material in the wavelength converting member to produce the desired wavelength spectrum. The wavelength converting member may be corrected by reducing or increasing the amount of wavelength converting material. In one embodiment, amount of wavelength converting material is reduced, e.g., through laser ablation or etching, to produce the desired wavelength spectrum.

BRIEF DESCRIPTION OF THE DRAWINGS

FIGS. 13A, 13B, and 13C illustrate top plan views and FIGS. 14A, 14B, and 14C illustrate side views of an embodiment of producing an LED device that emits light with a desired correlated color temperature.

FIGS. 15A, 15B, and 15C illustrate top plan views of a device similar to the device shown in FIG. 13C, but with the wavelength converting member ablated as a series of holes.

DETAILED DESCRIPTION

Figure 1A:
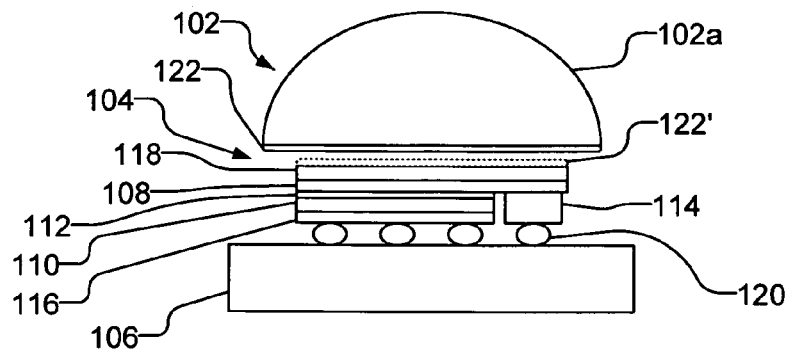
FIG. 1A illustrates a side view of an LED die mounted on a submount and an optical element that is to be bonded to the LED die.
Figure 1B:
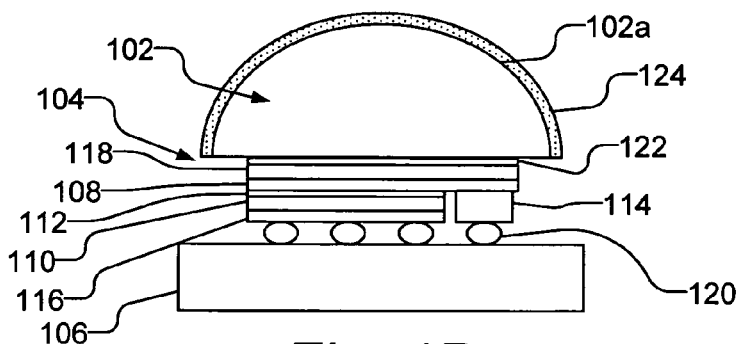
FIG. 1B illustrates the optical element bonded to the LED die.

FIG. 1A illustrates a side view of a transparent optical element 102 and a light emitting diode (LED) die 104 that is mounted on a submount 106. The optical element 102 can be bonded to the LED die 104 in accordance with an embodiment of the present invention. FIG. 1B illustrates the optical element 102 bonded to the LED die 104.

The term "transparent" is used herein to indicate that the element so described, such as a "transparent optical element," transmits light at the emission wavelengths of the LED with less than about 50%, preferably less than about 10%, single pass loss due to absorption or scattering. The emission wavelengths of the LED may lie in the infrared, visible, or ultraviolet regions of the electromagnetic spectrum. One of ordinary skill in the art will recognize that the conditions "less than 50% single pass loss" and "less than 10% single pass loss" may be met by various combinations of transmission path length and absorption constant.

LED die 104 illustrated in FIGS. 1A and 1B includes a first semiconductor layer 108 of n-type conductivity (n-layer) and a second semiconductor layer 110 of p-type conductivity (p-layer). Semiconductor layers 108 and 110 are electrically coupled to an active region 112. Active region 112 is, for example, a p-n diode junction associated with the interface of layers 108 and 110. Alternatively, active region 112 includes one or more semiconductor layers that are doped n-type or p-type or are undoped. LED die 104 includes an n-contact 114 and a p-contact 116 that are electrically coupled to semiconductor layers 108 and 110, respectively. Contact 114 and contact 116 can be disposed on the same side of LED die 104 in a "flip chip" arrangement. A transparent superstrate 118 coupled to the n layer 108 may be formed from a material such as, for example, sapphire, SiC, GaN, GaP, diamond, cubic zirconia (ZrO2), aluminum oxynitride (AlON), AlN, spinel, ZnS, oxide of tellurium, oxide of lead, oxide of tungsten, polycrystalline alumina oxide (transparent alumina), and ZnO. Alternatively, the substrate or superstrate can be removed so that only the layers that are epitaxially grown on the substrate or superstrate are present. In one embodiment, the substrate or superstrate is removed after the LED die is mounted to the submount. This can be accomplished by a wet or dry etch or by a laser lift-off process.

Active region 112 emits light upon application of a suitable voltage across contacts 114 and 116. In alternative implementations, the conductivity types of layers 108 and 110, together with respective contacts 114 and 116, are reversed. That is, layer 108 is a p-type layer, contact 114 is a p-contact, layer 110 is an n-type layer, and contact 116 is an n-contact.

Semiconductor layers 108 and 110 and active region 112 may be formed from III-V semiconductors including but not limited to AlN, AlP, AlAs, AlSb, GaN, GaP, GaAs, GaSb, InN, InP, InAs, InSb, II-VI semiconductors including but not limited to ZnS, ZnSe, CdSe, ZnO, CdTe, group IV semiconductors including but not limited to Ge, Si, SiC, and mixtures or alloys thereof.

Contacts 114 and 116 are, in one implementation, metal contacts formed from metals including but not limited to gold, silver, nickel, aluminum, titanium, chromium, platinum, palladium, rhodium, rhenium, ruthenium, tungsten, and mixtures or alloys thereof.

Although FIGS. 1A and 1B illustrate a particular structure of LED die 104, the present invention is independent of the structure of the LED die. Accordingly, other types of LED configurations may be used instead of the specific configuration shown. Further, the number of semiconductor layers in LED die 104 and the detailed structure of active region 112 may differ. It should be noted that dimensions of the various elements of LED die 104 illustrated in the various figures are not to scale.

The LED die 104 can be mounted to submount 106 via contacts elements 120, such as solder bumps, pads, or other appropriate elements, such as a layer of solder or metal. Contact elements 120 will be sometimes referred to herein as bumps 120 for the sake of simplicity. Bumps 120 are manufactured from Au, Sn, Ag, Sb, Cu, Pb, Bi, Cd, In, Zn or alloys thereof including AuSn, SnSb, SnCu, SnAg, SnAgBi, InSn, BiPbSn, BiPbCd, BiPbIn, InCd, BiPb, BiSn, InAg, BiCd, InBi, InGa, or other appropriate material with a melting temperature that is greater than the temperature that will be used to bond the optical element 102 to the LED die 104, but is preferably Au or AuSn. In one implementation, the melting temperature of bumps 120 is greater than 250° C. and preferably greater than 300° C. The submount 106 may be, e.g., silicon, alumina or AlN and may include vias for backside connections.

The LED die 104 can be mounted to the submount 106, e.g., using thermosonic bonding. For example, during the thermosonic bonding process, the LED die 104 with bumps 120 are aligned with the submount 106 in the desired position while the submount 106 is heated to approximately 150-160° C. A bond force of, e.g., approximately 50-100 gm/bump, is applied to the LED die 104 by a bonding tool, while ultrasonic vibration is applied. Other desired processes may be used, such as thermo-compression, to bond the LED die 104 to the submount 106. As is well known in the art, with thermo-compression higher temperatures and greater bonding forces are typically required than for an ultrasonic attachment.

In some embodiments, an underfill may be used with the LED die 104 and submount 106. The underfill material may have good thermal conductivity and have a coefficient of thermal expansion that approximately matches the LED die 104 and the submount 106. The underfill may also be used to block light emitted from the side of the die. In another embodiment, a protective side coat, e.g., of silicone or other appropriate material, may be applied to the sides of the LED die 104 and the submount 106. The protective side coating acts as a sealant and limits exposure of the LED 104 and the bumps 120 to contamination and the environment. The protective side coating can also have optical properties such as preventing an undesired color light from being emitted, converting the undesired light into a desired color, or recycling the undesired light back into the chip for a second chance to exit as the desired color.

For more information regarding producing bumps 120 from Au or Au/Sn and for submounts with backside vias and bonding LED dice with Au or Au/Sn bumps to a submount, see U.S. Ser. No. 10/840,459, by Ashim S. Haque, filed May 5, 2004, which has the same assignee as the present disclosure and is incorporated herein by reference. It should be understood, however, that the present invention is not limited to any specific type of submount and that any desired submount configuration and any desired contact element may be used if desired. In some applications, for example, a contact pad may be desirable.

Figure 1C:
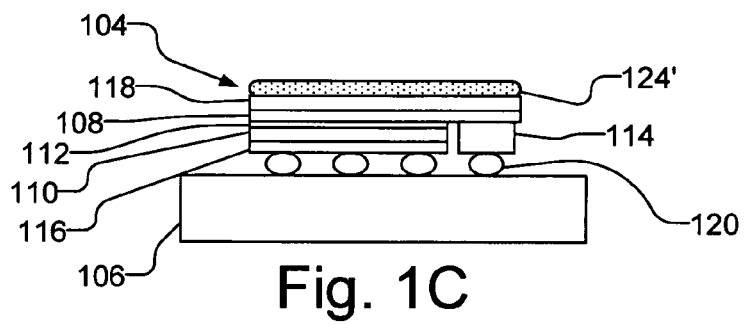
FIG. 1C illustrates a wavelength converting member bonded to the LED die.

In one embodiment, after the LED die 104 is mounted to the submount 106, the optical element 102 is thermally bonded to the LED die 104. A layer of bonding material can be applied to the bottom surface of the optical element 102 to form transparent bonding layer 122 that is used to bond optical element 102 to LED die 104. In some embodiments, the transparent bonding layer 122 may be applied to the top surface of the LED die 104, e.g., to superstrate 118, (as indicated by the dotted lines 122' in FIG. 1A). If the superstrate 118 is removed, bonding layer 122' may be applied to semiconductor layer 108. The bonding layer 122' can be applied to the LED die 104 prior to or after mounting the LED die 104 to the submount 106. Alternatively, no bonding layer may be used and the optical element 102 may be bonded directly to the LED die 104, e.g., the superstrate 118 or layer 108 if the superstrate 118 is removed. The transparent bonding layer 122 is, for example, about 10 Angstroms (Å) to about 100 microns (μm) thick, and is preferably about 1000 Å to about 10 μm thick, and more specifically, about 0.5 μm to about 5 μm thick. The bonding material is applied, for example, by conventional deposition techniques including but not limited to spin coating, spraying, sputtering, evaporation, chemical vapor deposition (CVD), or material growth by, for example, metal-organic chemical vapor deposition (MOCVD), vapor phase epitaxy (VPE), liquid phase epitaxy (LPE), or molecular beam epitaxy (MBE), or by dispensing a liquid resin, organic and/or inorganic, that acts as the bonding agent. Other bonding methods are also possible, such as the use of UV cured adhesives. In one embodiment, the optical element 102 may be covered with a wavelength converting material 124, which will be discussed in more detail below. In another embodiment, such as illustrated in FIG. 1C, a wavelength converting material 124' is bonded to the LED die 104 without an intervening optical element 102 and bonding layer 122. If desired, a bonding layer 122 may be used with the wavelength converting material 124'. In some embodiments, the surface of the wavelength converting material 124' and/or the surface of the LED 104, superstrate 118 or semiconductor layer 108, if superstrate 118 is removed, is patterned or roughened, e.g. using ablation, sawing, and/or other means such as wet or dry etching with or without lithography, to frustrate TIR and to increase the proportion of light that escapes and/or imparts some useful beam shaping quality to the emission cone.

In one implementation, the transparent bonding layer 122 is formed from a glass bonding material such as SF59, LaSF 3, LaSF N18, SLAH51, LAF10, NZK7, NLAF21, LASFN35, SLAM60, or mixtures thereof, which are available from manufactures such as Schott Glass Technologies Incorporated, of Duryea, Pa. and Ohara Corporation in Somerville, N.J. Bonding layer 122 may also be formed from a high index glass, such as (Ge, As, Sb,Ga)(S,Se, Te, Cl, I, Br) chalcogenide or chalcogen-halogenide glasses, for example. If desired, lower index materials, such as glass and polymers may be used. Both high and low index resins, for example, silicone or siloxane available from manufactures such as Shin-Etsu Chemical Co., Ltd., Tokyo, Japan. The side chains of the siloxane backbone may be modified to change the refractive index of the silicone.

In other implementations, bonding layer 122 may be formed from III-V semiconductors including but not limited to GaP, InGaP, GaAs, and GaN; II-VI semiconductors including but not limited to ZnS, ZnSe, ZnTe, CdS, CdSe, and CdTe; group IV semiconductors and compounds including but not limited to Si, and Ge; organic semiconductors, metal oxides including but not limited to oxides of antimony, bismuth, boron, copper, niobium, tungsten, titanium, nickel, lead, tellurium, phosphor, potassium, sodium, lithium, zinc, zirconium, indium tin, or chromium; metal fluorides including but not limited to magnesium fluoride, calcium fluoride, potassium fluoride, sodium fluoride, and zinc fluoride; metals including but not limited to Zn, In, Mg, and Sn; yttrium aluminum garnet (YAG), phosphide compounds, arsenide compounds, antimonide compounds, nitride compounds, high index organic compounds; and mixtures or alloys thereof.

In some embodiments, the transparent bonding layer 122 may be applied to the top surface of the LED die 104, e.g., to superstrate 118, (as indicated by dotted lines 122' in FIG. 1A). The bonding layer 122' can be applied to the LED die 104 prior to mounting the LED die 104 to the submount 106. Alternatively, no bonding layer may be used and the optical element 102 may be bonded directly to the LED die 104, e.g., the superstrate 118 or layer 108 if the substrate is removed. In implementations where the LED die 104 is configured with the n-contact and p-contact on opposite sides of the die 104, the transparent bonding layer 122 or 122' may be patterned with, for example, conventional photolithographic and etching techniques to leave the top contact uncovered by bonding material and thus to permit electrical contact with a metallization layer on the optical element 102, which may serve as a lead, as is described in U.S. Ser. No. 09/880,204, filed Jun. 12, 2001, by Michael D. Camras et al., entitled "Light Emitting Diodes with Improved Light Extraction Efficiency" having Pub. No. 2002/0030194, which is incorporated herein by reference.

In one implementation, the optical element 102 is formed from optical glass, high index glass, GaP, CZ, ZnS, SiC, sapphire, diamond, cubic zirconia (ZrO2), AlON, by Sienna Technologies, Inc., polycrystalline aluminum oxide (transparent alumina), spinel, Schott glass LaFN21, Schott glass LaSFN35, LaF2, LaF3, and LaF10 available from Optimax Systems Inc. of Ontario, N.Y., an oxide of Pb, Te, Zn, Ga, Sb, Cu, Ca, P, La, Nb, or W, or any of the materials listed above for use as bonding materials in transparent bonding layer 122, excluding thick layers of the metals.

The transparent optical element 102 may have a shape and a size such that light entering optical element 102 from LED die 104 will intersect surface 102a of optical element 102 at angles of incidence near normal incidence. Total internal reflection at the interface of surface 102a and the ambient medium, typically air, is thereby reduced. In addition, since the range of angles of incidence is narrow, Fresnel reflection losses at surface 102a can be reduced by applying a conventional antireflection coating to the surface 102a. The shape of optical element 102 is, for example, a portion of a sphere such as a hemisphere, a Weierstrass sphere (truncated sphere), or a portion of a sphere less than a hemisphere. Alternatively, the shape of optical element 102 is a portion of an ellipsoid such as a truncated ellipsoid, a side emitter or may be elongated in shape to accommodate a LED array or rectangular LEDs as described in US 2005/0023545, by the same assignee and which is incorporated herein by reference. The angles of incidence at surface 102a for light entering optical element 102 from LED die 104 more closely approach normal incidence as the size of optical element 102 is increased. Accordingly, the smallest ratio of a length of the base of transparent optical element 102 to a length of the surface of LED die 104 is preferably greater than about 1, more preferably greater than about 2.

After the LED die 104 is mounted on the submount 106, the optical element 102 can be thermally bonded to the LED die 104. For example, to bond the optical element 102 to the LED die 104, the temperature of bonding layer 122 is raised to a temperature between about room temperature and the melting temperature of the contact elements 120, e.g., between approximately 150° C. to 450° C., and more particularly between about 200° C. and 400° C., and optical element 102 and LED die 104 are pressed together at the bonding temperature for a period of time of about one second to about 6 hours, preferably for about 30 seconds to about 30 minutes, at a pressure of about 1 pound per square inch (psi) to about 6000 psi. By way of example, a pressure of about 700 psi to about 3000 psi may be applied for between about 3 to 15 minutes. If desired, other bonding processes may be used.

The thermal bonding of the optical element 102 to the LED die 104 requires the application of elevated temperatures. With the use of contact elements 120 that have a high melting point, i.e., higher than the elevated temperature used in the thermal bonding process, the LED die 104 may be mounted to the submount 106 before the optical element 102 is bonded to the LED die 104 without damaging the LED die/submount connection. Mounting the LED die 104 to the submount 106 prior to bonding the optical element 102 simplifies the pick and place process.

Bonding an optical element 102 to an LED die 104 is described in US Pub. No. 2002/0030194; 2005/0032257; Ser. No. 09/660,317, filed Sep. 12, 2000, by Michael D. Camras et al., entitled "Light Emitting Diodes with Improved Light Extraction Efficiency"; U.S. Pat. Nos. 6,987,613; or 7,009, 213, all of which have the same assignee as the present application and which are incorporated herein by reference. Further, the process of bonding optical element 102 to LED die 104 described above may be performed with devices disclosed in U.S. Pat. Nos. 5,502,316 and 5,376,580, incorporated herein by reference, previously used to bond semiconductor wafers to each other at elevated temperatures and pressures. The disclosed devices may be modified to accommodate LED dice and optical elements, as necessary. Alternatively, the bonding process described above may be performed with a conventional vertical press. In one embodiment, a mass bonding process can be performed with many devices at once in an oven, with or without pressure.

It should be noted that due to the thermal bonding process, a mismatch between the coefficient of thermal expansion (CTE) of optical element 102 and LED die 104 can cause optical element 102 to delaminate or detach from LED die 104 upon heating or cooling. Accordingly, optical element 102 should be formed from a material having a CTE that approximately matches the CTE of LED die 104. Approximately matching the CTEs additionally reduces the stress induced in the LED die 104 by bonding layer 122 and optical element 102. With suitable CTE matching, thermal expansion does not limit the size of the LED die that may be bonded to the optical element and, thus, the optical element 102 may be bonded to a large LED die 104, e.g., up to 1 mm$^2$, up to 2 mm$^2$, up to 4 mm$^2$, up to 9 mm$^2$, up to 16 mm$^2$, or larger than 16 mm$^2$.

Figure 2:
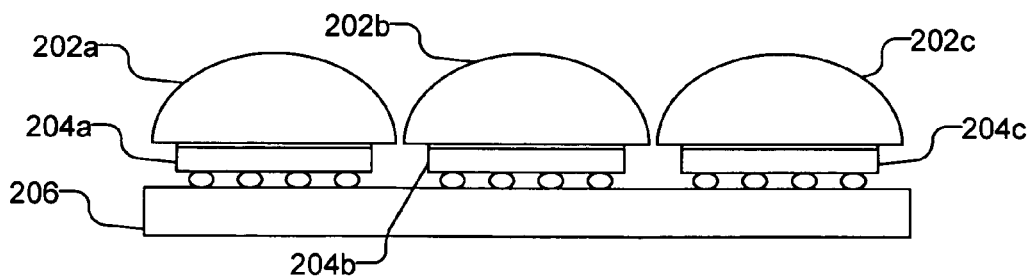
FIG. 2 illustrates an embodiment in which multiple LED dice are mounted to a submount and a separate optical element is bonded to each LED die.

FIG. 2 illustrates an embodiment in which multiple LED dice 204a, 204b, and 204c (sometimes collectively referred to as LED dice 204) are mounted on a submount 206. The LED dice 204 are schematically illustrated in FIG. 2 without showing the specific semiconductor layers. Nevertheless, it should be understood that the LED dice 204 may be similar to LED die 104 discussed above.

The LED dice 204 are each mounted to submount 206 as described above. Once the LED dice 204 are mounted on submount 206, individual optical elements 202a, 202b, and 202c can be bonded to LED dice 204a, 204b, and 204c, respectively, in a manner such as that described above.

If desired, the LED dice 204 may be the same type of LED and may produce the same wavelengths of light. In another implementation, one or more of the LED dice 204 may produce different wavelengths of light, which when combined may be used to produce light with a desired correlated color temperature (CCT), e.g., white light. Another optical element (not shown in FIG. 2) may be used to cover optical elements 202a, 202b, and 202c and aid in mixing the light.

Figure 3:
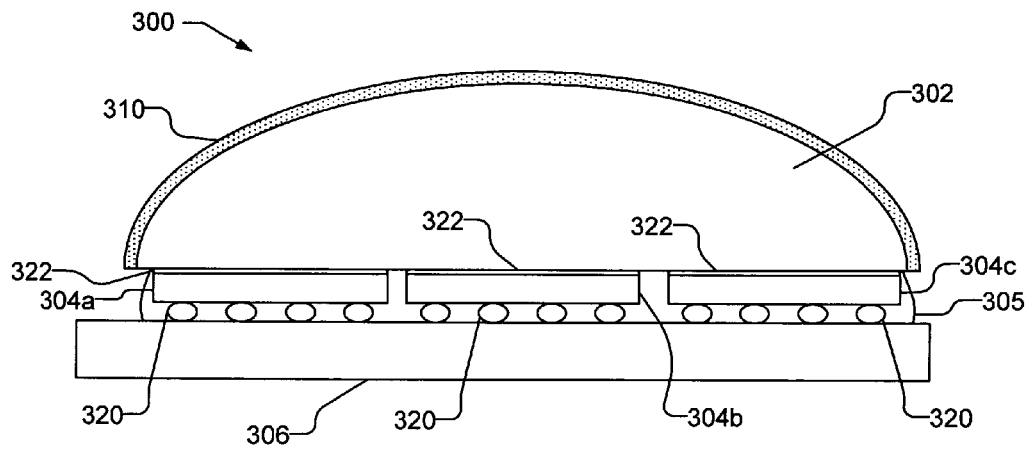
FIG. 3 illustrates an embodiment in which multiple LED dice are mounted to a submount and a single optical element with a wavelength converting layer is bonded to the LED dice.

FIG. 3 illustrates an embodiment of an LED device 300 that includes multiple LED dice 304a, 304b, and 304c (sometimes collectively referred to as LED dice 304) mounted on a submount 306 and a single optical element 302 bonded to the LED dice 304. The LED dice 304 may be similar to LED die 104 discussed above.

The use of a single optical element 302 with multiple LED dice 304, as shown in FIG. 3, is advantageous as the LED dice 304 can be mounted close together on submount 306. Optical components typically have a larger footprint than an LED die to which it is bonded, and thus, the placement of LED dice with separate optical elements may be constrained by the size of the optical elements.

After the LED dice 304 are mounted to the submount, there may be slight height variations in the top surfaces of the LED dice 304, e.g., due to the differences in the height of the contact elements 320 and thickness of the dice. When the single optical element 302 is thermally bonded to the LED dice 304, any differences in the height of the LED dice 304 may be accommodated by the compliance of the contact elements 320.

During the thermal bonding process of the optical element 302 to the LED dice 304, the LED dice 304 may shift laterally due to the heating and cooling of the submount 306. With the use of some contact elements 320, such as Au, the compliance of the contact elements 320 can be inadequate to accommodate lateral shift of the LED dice 304. Accordingly, the coefficient of thermal expansion of the optical element 302 ($CTE_{302}$) should approximately match the coefficient of thermal expansion of the submount 306 ($CTE_{306}$). With an approximate match between $CTE_{302}$ and $CTE_{306}$ any movement of the LED dice 304 caused by the expansion and contraction of the submount 306 will be approximately matched by the expansion and contraction of the optical element 302. A mismatch between $CTE_{302}$ and $CTE_{306}$, on the other hand, can result in the delamination or detachment of the LED dice 304 from the optical element 302 or other stress induced damage to the LED device 300, during the heating and cooling of the thermal bonding process.

With the use of sufficiently small LED dice 304, the thermal expansion of the LED dice 304 themselves during the thermal bonding process may be minimized. With the use of large LED dice 304, however, the amount of thermal expansion of the LED dice 304 during the thermal bonding process may be large and thus, the CTE for the LED dice 304 also should be appropriately matched to approximately the CTE of the submount 306 and the optical element 302.

The LED dice 304 may be, e.g., InGaN, AlInGaP, or a combination of InGaN and AlInGaP devices. In one implementation, the submount 302 may be manufactured from AlN, while the optical element 302 may be manufactured from, e.g., SLAM60 by Ohara Corporation, or NZK7 available from Schott Glass Technologies Incorporated. In another implementation, an Alumina submount 306 may be used along with an optical element 302 manufactured from sapphire, Ohara Glass SLAH51 or Schott glass NLAF21. In some implementations, a bulk filler 305 between the LED dice 304 and the submount 306 may be used. The bulk filler 305 may be, e.g., epoxy, silicone, or glass. The bulk filler 305 may have good thermal conductivity and may approximately match the CTE of the submount 306 and the dice 304. If desired, a protective side coating may be applied alternatively or in addition to the bulk filler 305. This protective side coating may be used to block side light from the die.

In one implementation, all of the LED dice 304 may be the same type and produce different or approximately the same wavelengths of light. Alternatively, with an appropriate choice of LED dice 304 and/or wavelength conversion materials, different wavelengths of light may be produced, e.g., blue, green and red. When LED dice 304 are the same type, the CTE for the LED dice 304 will be approximately the same. It may be desirable for the CTE of the LED dice 304 to closely match the coefficient of thermal expansion of the optical element 302 and the submount 306 to minimize the risk of delamination or detachment or stress induced damage to the LED device 300 during the thermal bonding process. An example of approximately CTE matched device 300 would consist of LED dice 304 containing a sapphire substrate, a sapphire or approximately CTE matched glass optical element 302, and an alumina submount 306. The degree of CTE matching can depend on parameters such as the compliance of the bonding materials, the temperature range that the device is bonded, processed, or operated and the bond area size. In some embodiments, CTE mismatch should be less than 10%. In other embodiments, a CTE mismatch of greater than 10% may be acceptable and also result in a reliable device.

In another implementation, the LED dice 304 may be different types and produce different wavelengths of light. With the use of different types of LED dice, the CTE of the dice can vary making it difficult to match the CTE for all the LED dice 304 with that of the optical element 302 and the submount 306. Nevertheless, with a judicious choice of the optical element 302 and submount 306 with CTEs that are as close as possible to that of the LED dice 304, problems associated with detachment of the LED dice 304 or other damage to the device 300 during the thermal bonding process may be minimized. Additionally, with the use of relatively small LED dice 304, e.g., the area smaller than approximately 1 mm$^2$, problems associated with thermal bonding a single optical element 302 to multiple dice 304 may also be reduced. The use of a bulk filler 305 may also prevent damage to the device during thermal processing or operation.

Figure 4:
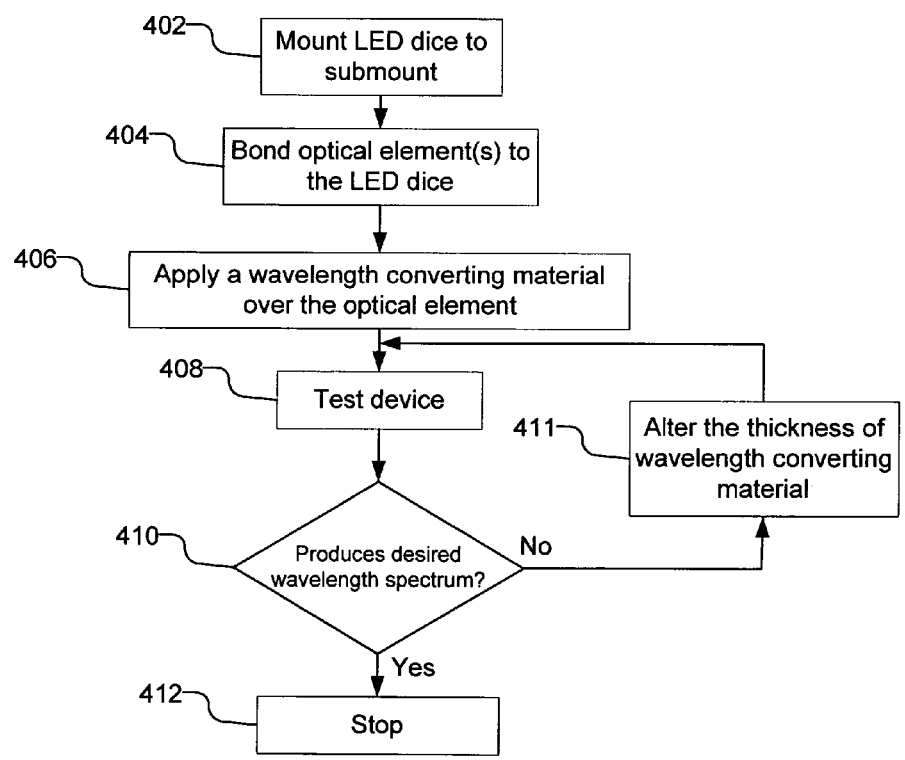
FIG. 4 is a flow chart of one implementation of producing such an LED device with wavelength converting material covering the optical element.

As shown in FIG. 3, in one implementation, the optical element 302 may be coated with a wavelength converting material to form wavelength converting member 310, such as a phosphor coating. In one embodiment, the wavelength converting material is YAG. Of course there are many variants of YAG and non-YAG phosphors that could be used if desired. Alternatively, multiple layers of different phosphors may be used, such as red and green phosphors that are used with a blue LED. FIG. 4 is a flow chart of one implementation of producing such a device. As illustrated in FIG. 4, the LED dice 304 are mounted to the submount 306 (step 402) and the optical element 302 is bonded to the LED dice 304 (step 404). After the optical element 302 is bonded to the LED dice 304, a layer of the wavelength converting material is deposited over the optical element 302 (step 406) to form a wavelength converting member 310. The device can then be tested, e.g., by applying a voltage across the active regions of the LED dice 304 and detecting the wavelength spectrum of light produced by the device (step 408). If the device does not produce the desired wavelength spectrum (step 410), the thickness of the wavelength converting member 310 is altered (step 411), e.g., by depositing additional wavelength converting material over the optical element 302 or by removing some of the wavelength converting material by ablation, etching or dissolution and the device is again tested (step 408). The process stops once the desired wavelength spectrum of light is produced (step 412). The wavelength spectrum of the device determines the CCT and its proximity to the plankian. Hence, it should be understood that a desired CCT range or a desired CCT range and its desired proximity to the plankian can determine the desired wavelength spectrum of light produced by the device.

Thus, the thickness of the wavelength converting member 310 coating is controlled in response to the light produced by the LED dice 304 resulting in a highly reproducible correlated color temperature. Moreover, because the deposition of the wavelength converting material is in response to the specific wavelengths produced by the LED dice 304, a variation in the wavelengths of light produced by LED dice 304 can be accommodated. Accordingly, fewer LED dice 304 will be rejected for producing light with an undesirable wavelength spectrum.

Although FIG. 4 is described for the embodiment shown in FIG. 3, it should be understood that the process of correcting the wavelength converting member 310 as shown in FIG. 4 may be applied to the embodiments shown in FIGS. 1B, 1C, and 2 as well. That is, wavelength converting member 124 in FIG. 1B, and wavelength converting members (not shown) on 202a, 202b, 202c in FIG. 2 can be corrected by the process of FIG. 4. Moreover, wavelength converting member 124' in FIG. 1C can be corrected by a similar process to that shown in FIG. 4, except that the wavelength converting material is applied to the LED die 104 without the intervening optical element. Also in another embodiment, the LED dice do not need to be mounted to a submount for the wavelength spectrum altering process. Other LED configurations and packaging may be used if desired.

FIGS. 13A, 13B, and 13C illustrate top plan views and FIGS. 14A, 14B, and 14C illustrate side views of an embodiment of producing an LED device that emits light with a desired correlated color temperature. A light emitting element, for example, LED die 802 in FIGS. 13A and 14A, is produced and mounted on a submount 804, along with an electrostatic discharge circuit (ESD) 806, such as a Zener diode. The LED die 802 may be produced and mounted to the submount 804 as described herein or if desired, other manufacturing and packaging processes may be used. For example, in some embodiments, a submount 804 need not be used. Alternatively, a lens or dome may be mounted over the LED die 802, such as that illustrated in FIG. 1A.

The light emitting element, for example, LED die 802 (or dome if used) is then coated with a wavelength converting material to form a wavelength converting member 808 as illustrated in FIGS. 13B and 14B to produce a light emitting device. For the sake of simplicity, the entire device including the submount 804 and the ESD circuit 806 may be covered with the wavelength converting member 808. A coating of wavelength converting material may be any of the types described herein and may be, e.g., a coating that is electrophoretically deposited (EPD). The coating of wavelength converting material can be infused with silicone, sol-gel, siloxane or any suitable resin, which may be cured.

Other types of wavelength converting members 808 and/or deposition techniques may be used if desired. For example, in one embodiment, the wavelength converting member 808 may be a phosphor spray coated layer instead of an EPD layer. Alternatively, dispense-jetting, could be used to deposit the wavelength converting member 808. Dispense-jetting is similar to ink-jetting but with larger drops that carry more material, which can be controlled in precise quantities and locations. The phosphor may be added to a resin, solvent, hardener, and/or thixotrophic agent. The viscosity and spray pattern may be adjusted to produce the desired coating of wavelength converting material. Moreover, the individual devices or submounts containing many devices can be rotated or otherwise moved during spraying to aid in coating uniformity. The spray gun can also move during coating. In another embodiment, the wavelength converting member material may be a light converting ceramic that is bonded to the die or disposed above the die. By way of example, a suitable light converting ceramic that may be used with the present invention is described in U.S. Pub. No. 2005/0269582, which has the same assignee as the present disclosure and is incorporated herein by reference. It may be preferable for a light converting ceramic to be the last optical element, i.e., there are no additional lens or encapsulation. A light converting ceramic may be ablated, e.g., using a short wavelength excimer laser.

The combination of the light converted by wavelength converting member 808 and the light emitted by the LED die 802 that leaks through the wavelength converting member 808 determines the specific wavelength spectrum produced by the light emitting device, i.e., the CCT. In one embodiment the wavelength converting member 808 is deposited on the LED die 802 too thick to produce the desired CCT. This allows the CCT of the device to be measured or tested and the wavelength converting member 808 to be corrected, i.e., wavelength converting material from the wavelength converting member 808 is removed in a controlled fashion to produce the desired CCT. Alternatively, the wavelength converting member may be deposited too thin to produce the desired CCT and additional wavelength converting material is added in a controlled fashion to produce the desired CCT.

Thus, once the wavelength converting member 808 is deposited, the light emitting device is tested and the CCT of the emitted light is measured. This process can be performed on individual devices, but throughput would be increased by performing this process in batches. This can be accomplished prior to singulating the LED devices or prior to singulating the submount.

In one embodiment, a computer controlled laser trimming process is used to ablate the wavelength converting member 808 to generate a corrected wavelength converting member 808 that produces the desired CCT. Where the LED devices are tested in batches, the computer controlled laser can ablate the wavelength converting member on each LED device by an amount specifically tailored for that device depending on the individual CCT for that device.

In one embodiment, the LED device may be tested and the wavelength converting member removed in an iterative process, such as that described in FIG. 4. In another embodiment, once the system is calibrated, i.e., the amount of wavelength converting material that must be removed to produce a specific change in CCT is known, the LED device can be measured once and the appropriate amount of material is removed from the wavelength converting member. Depending on the amount of material to be removed, it may be necessary to ablate the wavelength converting material using multiple passes, where each pass only removes a small amount of material. The use of multiple passes reduces the risk of charring the resin in the wavelength converting material if it is removed with a laser. With the use of a light converting ceramic, there is no resin and thus, it is less likely to char, but it can be more difficult to ablate.

FIGS. 13C and 14C illustrate the wavelength converting member 808 after being laser ablated. As illustrated in FIG. 13C, a series of lines 808*l* and spaces 808*s* may be used to alter the thickness of the wavelength converting member 808, e.g., the amount of wavelength converting material over the LED die 802 is reduced. In one embodiment, the reduction of the thickness may be over a localized area as opposed to the entire die. In one embodiment, there may be a reduction in thickness at one location and an increase in thickness at another location on the same die. It should be understood that the lines and spaces illustrated in FIG. 13C are illustrative and in practice it may be desirable to use a much smaller pitch. In one embodiment, the wavelength converting member 808 is completely removed in localized areas to expose the underlying LED die 802, thereby forming spaces 808*s*. In such an embodiment, the average thickness of the wavelength converting member 808 is reduced despite the thickness of the lines 808*l* remaining unchanged. The average thickness can be altered, e.g., by increasing the width of the spaces and/or or decreasing the width of the lines. In general, the use of a fine pitch and/or low amplitude is desirable. In one embodiment, the low amplitude laser ablation may remove only a portion of the thickness of the wavelength converting member 808 such that the wavelength converting material in spaces 808*s* is thinner than in the lines 808*l*, but the underlying LED die 802 is still entirely covered by the wavelength converting member 808.

Figure 15C:
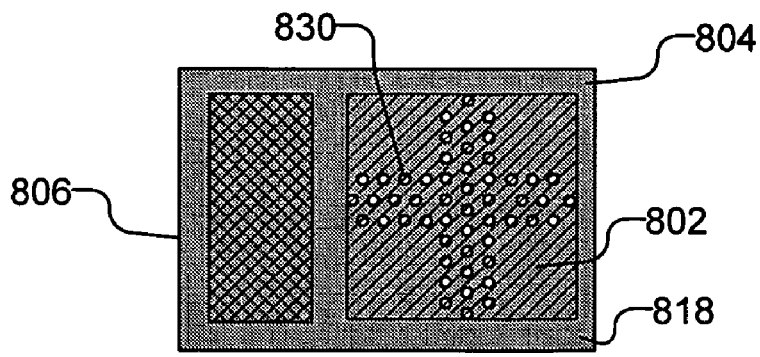

Patterns other than lines and spaces may be used to alter the thickness of the wavelength converting member. For example, FIG. 15A illustrates a top plan view of a device similar to the device shown in FIG. 13C, but with the wavelength converting member 818 ablated with a series of holes 818*h* as opposed to lines and spaces. The distance between the holes 818*h* and/or the radius of the holes 818*h* may be varied in order to alter the average thickness of the wavelength converting member 818 to obtain the desired CCT. Alternatively, different patterns or the same pattern with different parameters may be used to remove the wavelength converting member in localized areas of the LED die 802. For example, a spatial map of the CCT may be generated when the LED device is tested and the CCT of the emitted light is measured. The spatial map of the CCT may be provided to the computer control and high spots on the coating may be ablated, so not only is the desired CCT obtained, but also the CCT is made more spatially uniform. FIG. 15B illustrates an embodiment in which holes 820*h* having a smaller radius are located in the center of the LED die 802 while larger radius holes 818*h* are located elsewhere. FIG. 15C illustrates an embodiment in which holes 830 are produced in a specific pattern, which may be, e.g., a design, symbol or emblem. The light source may then be imaged so that the pattern formed by holes 830 is produced having a different color than the surrounding light.

If desired, processes other than laser ablation may be used to remove the wavelength converting member material. For example, the wavelength converting member may be trimmed using other techniques including mechanical and/or chemical etching, ion beam, or electron beam ablation.

Figure 9:
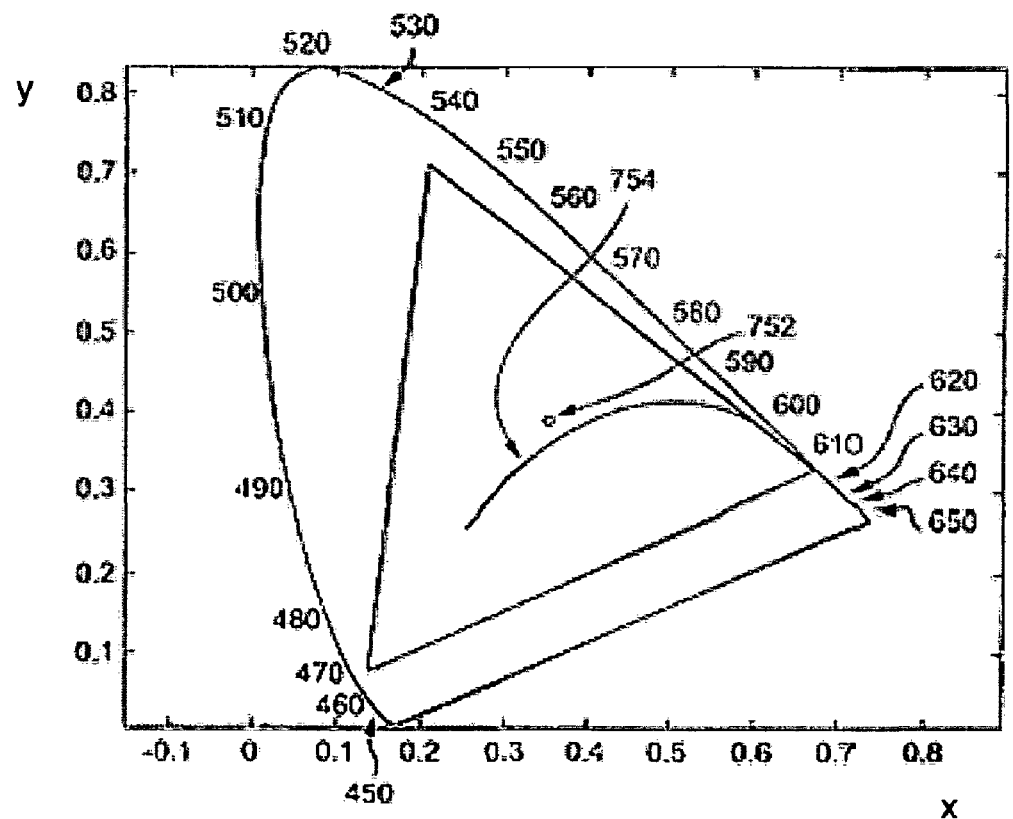
FIG. 9 is a CIE chromaticity diagram with a point marked for the spectrum shown in FIG. 8.
Figure 11:
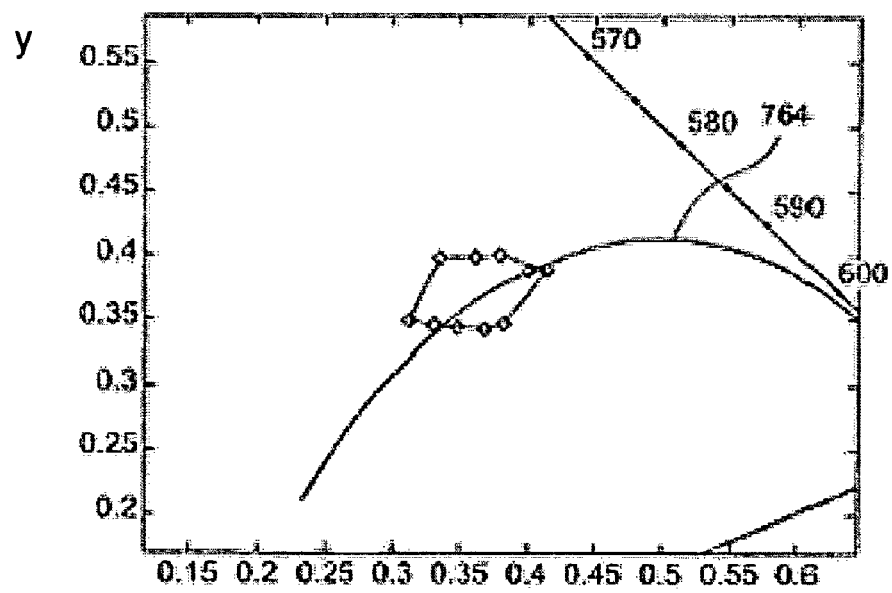
FIG. 11 is the color space that shows the variation in the CCT that may be produced by varying the brightness of the colored LEDs.
Figure 12:
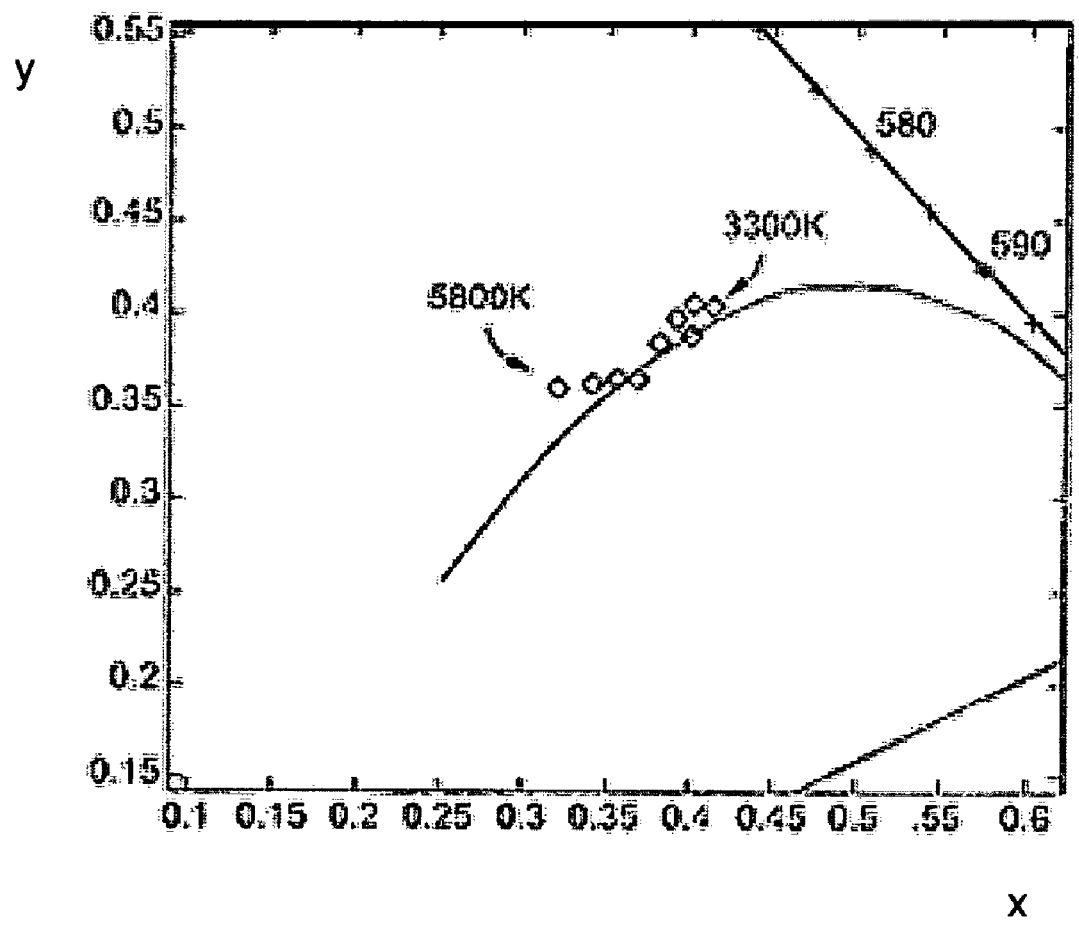
FIG. 12 is the color space that illustrates variable CCT values for an array of 29 phosphor converted LEDs and 12 color LEDs.
Figure 16:
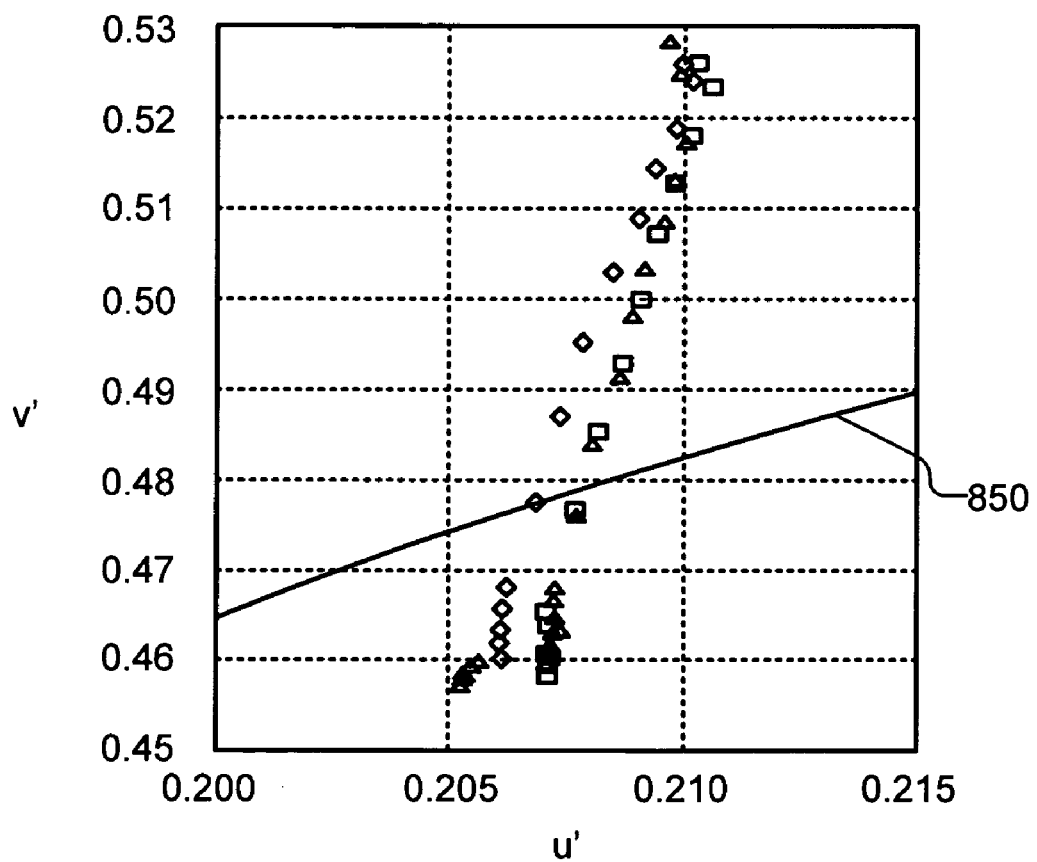
FIG. 16 is the color space showing the change in the CCT of LED devices during laser ablation of the wavelength converting members.

The amount of wavelength converting material removed depends on the initial CCT and the desired CCT to be obtained. FIG. 16 is a graph illustrating the luminance-chrominance or color space using u'v' coordinates, commonly referred to as u'v' space, where the line 850 is the plankian. FIG. 16 illustrates the test results of three different LED devices with wavelength converting members, which were deposited on the LED dice, tested, and ablated to alter the wavelength spectrum produced, which reduces the v' value and to a lesser extent reduces the u' value and increases the CCT. The initial u'v' points of the LED devices are shown at the top of the graph. Each data point in FIG. 16 illustrates that after each laser ablation, the u'v' coordinates are further decreased. In practice, no further ablation would be performed once the LED device produces a desired CCT, preferably producing the desire CCT that is on or near the plankian 850. Thus, the wavelength spectrum produced by the LED devices is altered until the devices produce a point within a desired area of the u'v' space. As one of ordinary skill in the art will understand, there are many types of space that may be used with the present embodiment, including, e.g., xy as shown in FIGS. 9, 11, and 12 or uv space. Thus, the present description of the use of u'v' space should be understood to include all other types of space as u'v' space can be easily transformed into another type of space and vice versa.

In FIG. 16, the ablation was performed in small successive steps, i.e., the pitch was not altered and a small amount of material was removed at each pass, to illustrate how fine the tuning can be. In a production environment, it may be desirable to use fewer ablation/measurement cycles. However, if too much material is ablated in a single pass, the binder is more likely to char.

Figure 5:
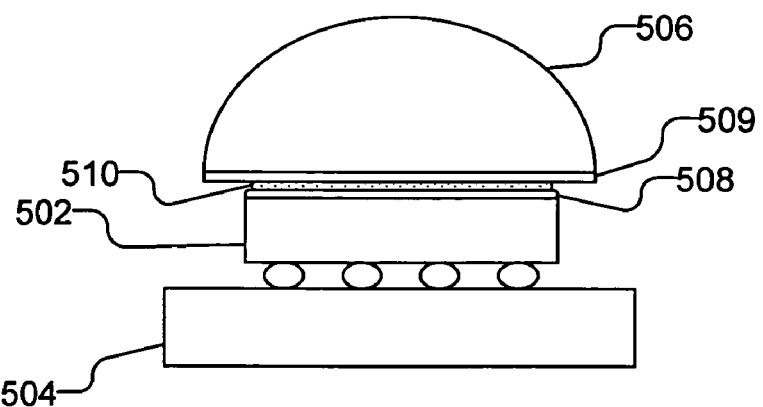
FIG. 5 illustrates an embodiment in which a layer of wavelength converting material is disposed between the bonding layer and the optical element.

In another implementation, the coating of wavelength converting material may be placed between the LED die and the optical element, e.g., within, over, or under the bonding layer 322. FIG. 5, by way of example, illustrates an LED die 502 mounted to a submount 504 and bonded to an optical element 506 via bonding layer 508, where a layer of wavelength converting material 510 is disposed between the bonding layer 508 and the optical element 506. The wavelength converting material 510 may be bonded to the bottom surface of the optical element 506 by bonding layer 509 prior to or during the bonding the optical element 506 to the LED die 502. The wavelength converting material 510 may be, e.g., a phosphor impregnated glass or wavelength converting ceramic that is formed independently and then bonded to the LED die 502 and optical element 506. In some embodiments, the wavelength converting material 510 may be bonded directly to one or both of the LED die 502 and optical element 506. In one embodiment, the optical element 506, LED die 502 and wavelength converting material 510 may be bonded together simultaneously. In another embodiment, the wavelength converting material 510 may be bonded first to the optical element 506 and subsequently bonded to the LED die 502, e.g., where the bonding layer 509 has a higher bonding temperature than the bonding layer 508. A suitable wavelength converting material, such as a phosphor impregnated glass, is discussed in more detail in U.S. Ser. No. 10/863,980, filed on Jun. 9, 2004, by Paul S. Martin et al., entitled "Semiconductor Light Emitting Device with Pre-Fabricated Wavelength converting member", which has the same assignee as the present application and is incorporated herein by reference. The wavelength converting material 510 may be larger in area than the die 502, may be the same in area as die 502, or may be slightly smaller in area than the die 502 as shown. If the wavelength converting material 510 is bonded to the optical element 506 before being bonded to die 502, a higher temperature bonding process may be used than the bonding process used to bond the wavelength converting material 510 to the LED die 502. Consequently, bonding material 509 may be a higher temperature bonding material than bonding material 508.

Figure 6:
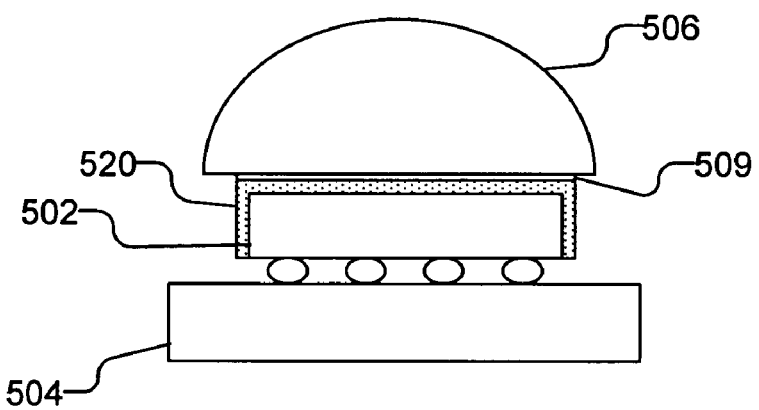
FIG. 6 illustrates an embodiment in which a layer of wavelength converting material is deposited on the LED die.

FIG. 6 illustrates another embodiment, similar to the embodiment shown in FIG. 5, except a wavelength converting material 520 is bonded to the LED die 502 (and optionally over the edges of the LED die 502) prior to or during bonding of the optical element 506. Thus, as shown in FIG. 6, the wavelength converting material 520 is placed between the LED die 502 and the bonding layer 509.

In another implementation, the coating of wavelength converting material may be located over the LED die or dice remotely, e.g., on an envelope of glass, plastic, epoxy, or silicone with a hollow space between the envelope and the LED die or dice. If desired, the hollow space may be filled with a material such as silicone or epoxy. In one embodiment, a wavelength converting material may be deposited on a standard T1¾ 5 mm LED lamp or a LUXEON lamp from Lumileds, Inc., for example, by spray coating. This coating may then be tested and corrected until the desired wavelength spectrum is produced.

Figure 7:
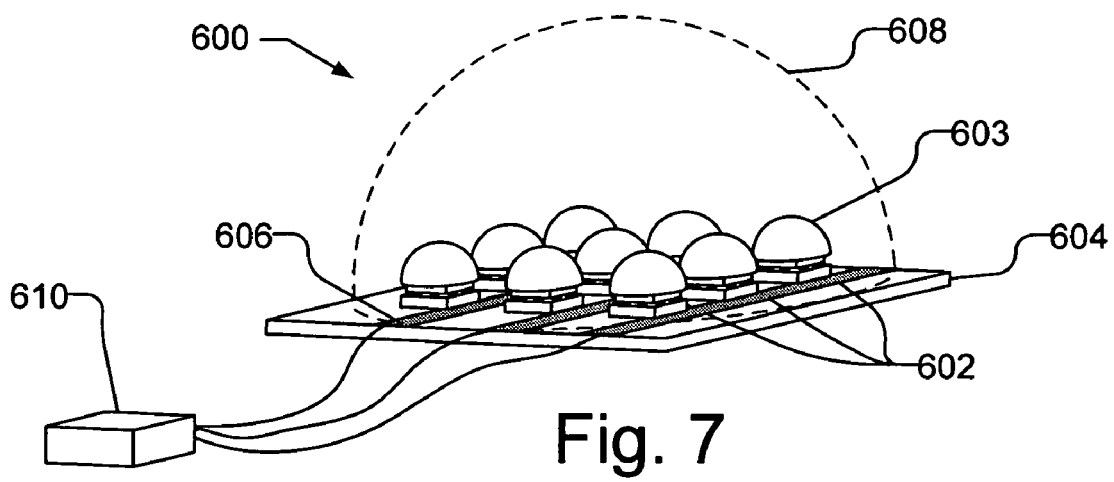
FIG. 7 illustrates an array of LEDs, which are mounted on a board.

FIG. 7 illustrates an array 600 of LEDs 602, which are mounted on a board 604. The board 604 includes electrical traces 606 that are used to provide electrical contact to the LEDs 602. The LEDs 602 may be phosphor converted devices manufactured, e.g., as described above. The LEDs 602 may each produce white light with different CCTs. By mixing the white light with different CCTs in array 600, a light with a desired CCT may be produced. If desired, the LEDs 602 may be covered with a transparent element 608 of e.g., glass, plastic, epoxy, or silicone. The transparent element 608 may be filled, e.g., with epoxy or silicone, which assists the extracting and mixing of the light and to protect the LEDs 602. It should be understood that array 600 may include any number of LEDs 602 and that if desired, one or more of the LEDs may produce non-white light. Moreover, if desired, a plurality of the LEDs 602 may be bonded to a single optical element 603, or one or more of the LEDs 602 may not include optical element 603.

Figure 8:
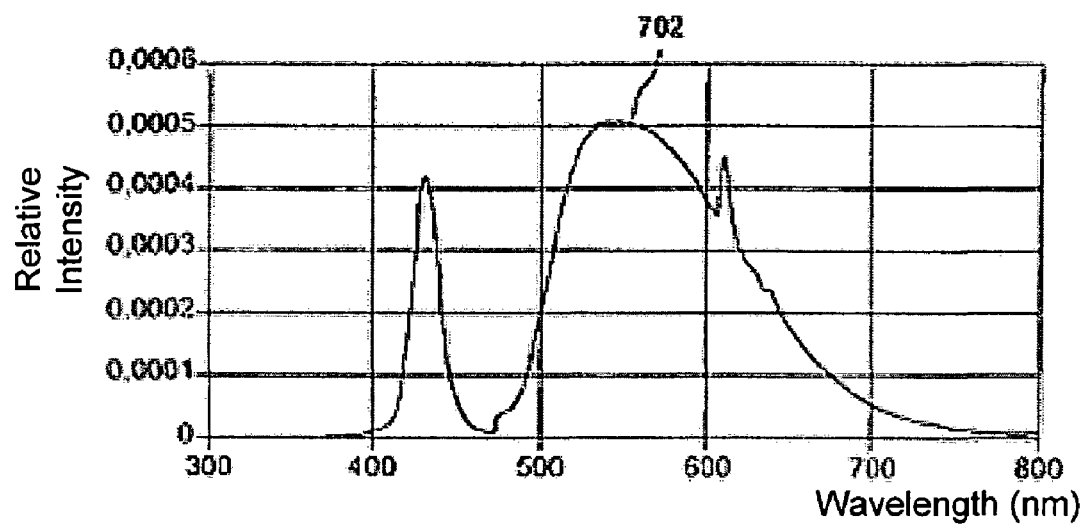
FIG. 8 is a graph of the broad spectrum produced by a phosphor converted blue LED.

As illustrated in FIG. 7, individual or groups of LEDs 602 may be independently controlled, e.g., by controller 610, which is electrically connected to the traces 606 on the board 604. By independently controlling LEDs 602 or groups of LEDs 602, a high color rendering, e.g., over 85, with a constant brightness may be achieved. Further, the white points produced by the array 600 may be tuneable over a large range of CCT, e.g., between 3000K and 6000K. By way of example, a number of phosphor-converted (PC) blue LEDs that produce white light may be used in combination with LEDs with different colors, such as blue, cyan, amber and red to produce a light with a desired CCT. As shown in the graph of FIG. 8, the phosphor converted blue LEDs generates light with a broad spectrum 702 in the green area in combination with a peak in the blue region. The thickness of the phosphor may be tuned to produce approximately equal peak values for both the green and blue parts of the spectrum. FIG. 9 shows a CIE chromaticity diagram for the spectrum shown in FIG. 8, which illustrates the x and y color coordinates 752 above the black bodyline 754. Of course, PC LEDs that produce spectra having peaks in other area may be used if desired. Alternatively, if desired, PC LEDs that produce different spectra, i.e., white light having different CCTs may be used together.

Figure 10:
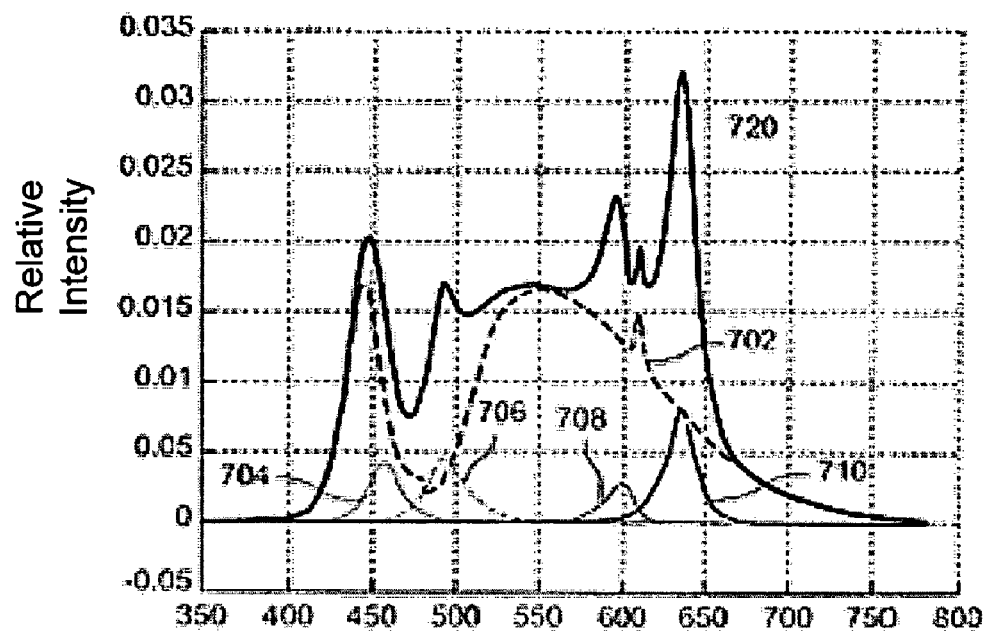
FIG. 10 is a graph of the spectra produced by phosphor converted LEDs and colored LEDs, which are combined to produce an approximately continuous spectrum.

A majority of the LEDs 602 in the array 600 of FIG. 7 may be PC LEDs that generate the spectrum shown in FIG. 8. The remaining LEDs 602 shown in FIG. 7 may be colored LEDs, e.g., LEDs that produce blue, cyan, amber and red. The brightness of the colored LEDs may be adjusted by controller 610. The combination of fully powered PC LEDs with colored LEDs generates an approximately continuous spectrum, as illustrated in FIG. 10. FIG. 10 shows a graph with the spectrum 702 from the PC LEDs along with spectra 704, 706, 708 and 710 from the blue, cyan, amber and red colored LEDs combined to form spectrum 720. As illustrated in the portion of the CIE chromaticity diagram shown in FIG. 11, by varying the brightness of the colored LEDs, an area that covers part of the black body line 764 can be obtained. By way of example, one embodiment that included 29 PC LEDs and 12 color LEDs is capable of producing a brightness of 800 lumen with a color rendering between 85 and 95 and a CCT between 3200K and 5800K. FIG. 12 illustrates a portion of the CIE chromaticity diagram that illustrates variable CCT values for an array of 29 PC LEDs and 12 color LEDs. Of course, any number of PC LEDs and color LEDs may be used.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. A method comprising:
   providing a light emitting element;
   depositing a layer of a wavelength converting material over the light emitting element;
   determining the wavelength spectrum of light emitted by the combination of the light emitting element and the wavelength converting material; and
   altering the amount of wavelength converting material on the light emitting element.

2. The method of claim 1, further comprising:
   repeatedly determining the wavelength spectrum of light emitted by the combination of the light emitting element and the wavelength converting material and altering the amount of wavelength converting material until a desired wavelength spectrum of light is produced.

3. The method of claim 2, wherein producing the desired wavelength spectrum of light produces a desired correlated color temperature.

4. The method of claim 2, wherein prodacing the desired wavelength spectrum of light produces a point within a desired area in color space.

5. The method of claim 1, wherein altering the amount of wavelength converting material comprises reducing the amount of wavelength converting material that is deposited on the light emitting element.

6. The method of claim 5, wherein reducing the amount of wavelength converting material that is deposited on the light emitting element comprises one of decreasing the thickness of the wavelength converting material approximately across the entire light emitting element and decreasing the thickness of the wavelength converting material in a localized area of the light emitting element.

7. The method of claim 5, wherein reducing the amount of wavelength converting material that is deposited on the light emitting element is performed by one of etching and ablation.

8. The method of claim 7, wherein altering the amount of wavelength converting material is performed by ablating the layer of wavelength convening material in one or more patterns.

9. The method of claim 8, wherein the pattern is at least one of a series of stripes and a series of holes.

10. The method of claim 8, wherein the pattern is at least one of a design, symbol or emblem.

11. The method of claim 8, wherein ablating the layer of wavelength converting material is performed using multiple passes over the layer of wavelength converting material.

12. The method of claim 1, wherein altering. the amount of wavelength converting material comprises increasing the thickness of the layer of the wavelength converting material.

13. The method of claim 1, wherein determining the wavelength spectrum of light emitted by the combination of the light emitting element and the wavelength converting material further comprises locating the wavelength spectrum of light in a color space and altering the amount of wavelength converting material on the light emitting element based on the location of the wavelength spectrum of light in the color space.

14. The method of claim 1, wherein determining the wavelength spectrum of light emitted by the combination of the light emitting element and the wavelength converting material further comprises generating a spatial map of the wavelength spectrum and altering the amount of wavelength converting material on the light emitting element based on the spatial map.

15. The method of claim 1, wherein depositing a layer of the wavelength converting material over a light emitting element comprises depositing the wavelength converting material on the light emitting element.

16. The method of claim 1, wherein depositing a layer of the wavelength converting material over a light emitting element comprises depositing the wavelength converting material on an optical element that is over the light emitting element.

17. The method of claim 1, wherein the wavelength converting material is a wavelength convening ceramic.

18. The method of claim 1, wherein the light emitting element is a light emitting diode.

19. A method comprising:
providing a light emitting element;
depositing a layer of a wavelength converting material over the light emitting element;
determining the wavelength spectrum of light emitted byte combination of the light emitting element and the wavelength converting material; and
altering the amount of wavelength converting material on the light emitting element in response to the determined wavelength spectrum.

20. The method of claim 19, wherein altering the amount of wavelength convening material comprises reducing the amount of wavelength converting material that was deposited on the light emitting element.

21. The method of claim 20, wherein reducing the amount of wavelength converting material that is deposited on the light emitting element is performed by one of etching and ablation.

22. The method of claim 19, wherein altering the amount of wavelength converting material comprises increasing the thickness of the layer of the wavelength converting material.

23. The method of claim 19, wherein the wavelength convening material is a wavelength converting ceramic.

* * * * *